(12) United States Patent
Maeng et al.

(10) Patent No.: US 7,465,638 B2
(45) Date of Patent: Dec. 16, 2008

(54) BIPOLAR TRANSISTOR AND FABRICATING METHOD THEREOF

(75) Inventors: Kye-Won Maeng, Seoul (KR);
Sung-Ryoul Bae, Suwon-si (KR);
Dong-Kyun Nam, Seoul (KR); Tae-Jin Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 407 days.

(21) Appl. No.: 11/411,840

(22) Filed: Apr. 27, 2006

(65) Prior Publication Data

US 2006/0252214 A1    Nov. 9, 2006

(30) Foreign Application Priority Data

Apr. 29, 2005   (KR) ............... 10-2005-0036005

(51) Int. Cl.
*H01L 21/331* (2006.01)
*H01L 29/70* (2006.01)

(52) U.S. Cl. .................. 438/343; 438/365; 257/586

(58) Field of Classification Search .......... 438/317, 438/322, 343, 365; 257/583–591
See application file for complete search history.

(56) References Cited

U.S. PATENT DOCUMENTS

| 5,480,815 | A | * | 1/1996 | Watanabe | 438/365 |
| 5,885,880 | A | * | 3/1999 | Gomi | 438/322 |
| 6,905,934 | B2 | * | 6/2005 | Hashimoto et al. | 438/309 |

FOREIGN PATENT DOCUMENTS

| JP | 06-232147 | 8/1994 |
| JP | 09-195512 | 7/1997 |
| KR | 1998-074222 | 11/1998 |

* cited by examiner

*Primary Examiner*—Calvin Lee
(74) *Attorney, Agent, or Firm*—Volentine & Whitt, PLLC (57) ABSTRACT

There is provided a bipolar transistor (with a respective fabrication method) that provides superior noise characteristics and gain diffusion. The fabricating method includes forming a first base region at a collector region, which in turn is formed on a substrate. A first silicon layer is formed on the base region, and a second silicon layer is formed on the first silicon layer using a forming method different from the method used in forming the first silicon layer. An emitter region is then formed from impurities at the base region by performing a thermal process.

17 Claims, 5 Drawing Sheets

Fig. 1

(PRIOR ART)

BIPOLAR TRANSISTOR AND FABRICATING METHOD THEREOF

BACKGROUND

1. Field of the Present Disclosure

The present disclosure relates to a semiconductor device and a fabricating method thereof, and more particularly, to a bipolar transistor and a fabricating method thereof.

2. Description of the Related Art

Technical developments in CMOS technology, i.e., technology where complementary n-channel and p-channel MOS transistors are formed on adjacent regions of a chip, has enabled the manufacturers of CMOS devices to create high-speed and high-density integrated circuits at low costs. Thus, CMOS devices have been used for a wide variety of applications, such as high frequency circuits and systems-on-chip. Although CMOS devices generally have superior operating characteristics compared to devices made using other technologies, CMOS is not a suitable technology to produce the low-noise circuitry necessary for certain high-frequency devices, such as low noise amplifiers (LNAs) or voltage controlled oscillators (VCOs).

In order to overcome these shortcomings, manufacturers have incorporated bipolar transistors on the same chip with CMOS transistors to create devices that perform dedicated circuit functions. In these mixed-technology chips, bipolar transistors are used for high frequency circuits while CMOS devices are used for logic circuits. This is because compared to the MOS field effect transistor the bipolar transistor has a lower noise characteristic, a wider linear gain range, a superior frequency response and a better current driving capability.

A bipolar transistor includes a base, an emitter and a collector. In the bipolar transistor, carriers move from the emitter to the collector by applying a forward bias between the emitter and the base and supplying a reverse bias between the base and the collector. Bipolar transistors can be classified as either a vertical bipolar transistor or a horizontal bipolar transistor according to the direction of carrier movement.

A vertical bipolar transistor has a stack structure made of a collector, a base and an emitter in sequence. A conventional vertical NPN bipolar transistor is formed by forming a P-type base region on an N-type emitter region, depositing an insulating layer, patterning the insulating layer to form an emitter window therein, and injecting an N-type impurity to the base region through the emitter window to form an emitter region. Unfortunately, it is very difficult to form a shallow emitter junction to a depth less than 300 nm through an ion implantation process. Nonetheless, such a shallow emitter junction depth is required to provide high operating speed.

In order to overcome the difficulty in forming shallow emitter junctions, a fabricating process was introduced that involves fabricating a vertical bipolar transistor by forming an un-doped polysilicon single layer after forming the emitter window, performing the ion implantation process to inject an N-type impurity into the un-doped polysilicon layer and performing a thermal process. For this bipolar transistor, the thickness of the emitter's un-doped polysilicon layer significantly affects the transistor's characteristics.

For transistors made according to this process, the un-doped polysilicon layer can be used as an emitter electrode after impurities are injected into the un-doped polysilicon layer and a thermal process is applied. In order to provide a low emitter electrode resistance, it might seem preferable to form the un-doped polysilicon layer to have a thick thickness. However, given that the junction depth profile of the emitter region is formed by diffusing an impurity into the base region through a thermal process, it might otherwise seem better to form the un-doped polysilicon to have a thin thickness. Such a manufacturing process is described below with reference to FIG. 1, which shows a cross-sectional view of a bipolar transistor formed while using a single polysilicon layer.

Figure 1:
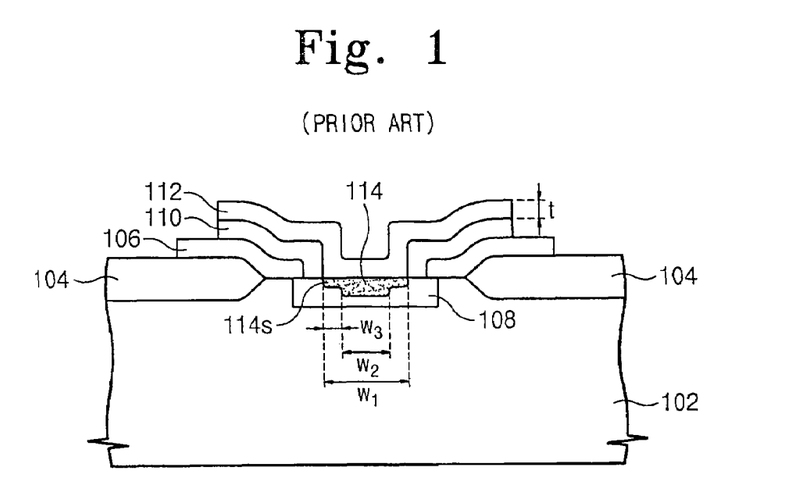
FIG. 1 is a cross-sectional view of a bipolar transistor formed by using a single polysilicon layer.

As shown in FIG. 1, the bipolar transistor includes a collector region 102, a device isolation layer 104, a base electrode 106, a base region 108, an insulating layer 110, a polysilicon emitter electrode 112 and an emitter region 114.

For a given emitter window width $W_1$, the width $W_2$ of the emitter region 114 decreases as a function of the thickness t of the polysilicon emitter electrode 112. That is, as the thickness t of the polysilicon emitter electrode 112 increases, width $W_2$ will decrease. This is because impurities are not well diffused into edge portions of the emitter as compared to other portions. Accordingly, an impurity junction region 114S formed at the edge portions will have a different depth as compared to other portions of the emitter region 114. That is, for a given emitter window width $W_1$, the width $W_3$ of impurity junction region 114S increases in proportional to the thickness t of polysilicon emitter electrode 112 while the width $W_2$ of emitter region 114 decreases.

In order to decrease resistance, the thickness t of polysilicon emitter electrode 112 must increase. However, an increase of the thickness t of the polysilicon emitter electrode 112 will cause the width $W_3$ of impurity junction region 114s to increase and the width $W_2$ of emitter region 114 to decrease proportionally. Unfortunately, variations in the width $W_3$ of impurity junction region 114S and the width $W_2$ of emitter region caused by standard variations in processing, such as width variations of the emitter window and thickness variations of the polysilicon emitter electrode, become greater in proportional to the width of polysilicon emitter electrode 114. Such variations degrades 1/f noise characteristics and gain deviation characteristics. It is expected that the 1/f noise characteristics and the gain deviation characteristics are closely related to the interface characteristics between the base region 108, the polysilicon emitter electrode 112 and any dangling bonds in the grain boundary of the polysilicon electrode. Dangling bonds affect the recombination of carriers moving from the base to the emitter and has a proportional relationship to base current. The 1/f noise is related to dangling bonds in proportional to a square of base current $I_B$.

Unfortunately, the conventional bipolar transistor described above cannot simultaneously provide low emitter resistance, superior 1/f noise characteristics and the desired gain deviation characteristics. This is because the conventional method of forming the emitter electrode and the emitter region using a single polysilicon layer causes the resistance of the emitter electrode, the 1/f noise characteristics and the gain deviation characteristics have a trade-off relationship to one another.

SUMMARY

Exemplary embodiments of the present disclosure provide a method of forming a bipolar transistor. In one embodiment, the method includes forming a plurality of impurity doped polysilicon layers on a base region and performing an annealing to form an emitter region. Each doped polysilicon layers can be formed by a different way.

The lowest impurity doped polysilicon layer contacting the base region can control a width and a junction depth profile of an emitter region. The upper most impurity doped polysilicon layer can control the resistance of a respective emitter electrode. The lowest impurity doped polysilicon layer prevents impurities in the upper most impurity doped polysilicon layer from being diffused into the base region. Therefore, 1/f noise characteristics and gain deviation characteristics can be adjusted by the lowest impurity doped polysilicon layer, and a low resistance emitter electrode can be formed by the uppermost impurity doped polysilicon layer. The lowest impurity doped polysilicon layer can be formed by implanting an impurity ion after forming an un-doped polysilicon layer. The upper most impurity doped polysilicon layer can be formed by in-situ doping, namely, by deposing a polysilicon layer with concurrently doping. The impurity injected into the un-doped polysilicon layer is then diffused into the base region by the thermal process to form the emitter region.

In one embodiment, the thickness of un-doped polysilicon layer may be controlled without regarding to the resistance of emitter electrode, thereby providing a proper 1/f noise characteristics and gain deviation characteristics. Also, the thickness and the doping concentration of upper most impurity doped polysilicon layer may be decided without regarding to the width and the concentration profile of emitter region. Accordingly, an emitter electrode having low resistance may be formed.

In another embodiment, bipolar transistor characteristics may be further improved by performing a thermal process in a hydrogen atmosphere after forming the emitter region. The thermal process with the hydrogen atmosphere improves the 1/f noise characteristics and the gain deviation characteristics. Such thermal processes for forming the emitter region may be performed after performing an ion implantation process on the lowest doped polysilicon layer or before forming the upper most doped polysilicon layer.

In yet another embodiment, an insulating layer can be formed on the upper most doped polysilicon layer in order to prevent the out-diffusion of impurity in the upper most doped polysilicon layer before performing the thermal process for impurity diffusion. The base region then may be formed by performing an ion implantation on the collector region or performing an epitaxial growth process.

In other various embodiments of the present disclosure, a bipolar transistor is provided with the bipolar transistor having a collector region of a second conductivity type formed on a substrate of a first conductivity type, a base region of a first conductivity type formed on the collector region, a first silicon layer implanted with a second conductivity type of impurities, a second silicon layer formed on the first silicon layer and in-situ doped with a second conductivity type of impurities and an emitter region formed in the base region, the emitter region being formed by diffusing the impurities of the first silicon layer into the base region.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

The present disclosure now will be described more fully hereinafter with reference to the accompanying drawings, in which embodiments of the present disclosure are shown. This present disclosure may, however, be embodied in many different forms and should not be construed as limited to the embodiments set forth herein. Rather, theses embodiments are provided so that this disclosure will be thorough and complete, and will fully convey the scope of the present disclosure to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on another element or intervening elements may also be present. The term "directly on" means that there are no intervening elements. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. Further, as used herein, the term "and/or" includes any and all combinations of one or more of the associated listed items.

It will be understood that, although the terms for first, second, third, etc. may be used herein to describe various elements such as region, film, layer, etc., these elements should not be limited by these terms. These terms are only used to distinguish one element from another. For example, a first layer could be termed a second layer, and, similarly, a second layer could be termed a first layer without depart from the teaching of the disclosure. In the drawings, the thicknesses of layers and regions are exaggerated for clarity.

The present disclosure relates to a method of fabricating a bipolar transistor. In order to clearly describe the present disclosure, a method of forming an NPN bipolar transistor will be described as an example. However, it is obvious that a PNP bipolar transistor may be formed according to the present disclosure by using impurities having an opposite polarity.

FIGS. 2 to 7 are cross-sectional views of an NPN bipolar transistor for describing a method of fabricating a bipolar transistor according to a first embodiment of the present disclosure.

Figure 2:
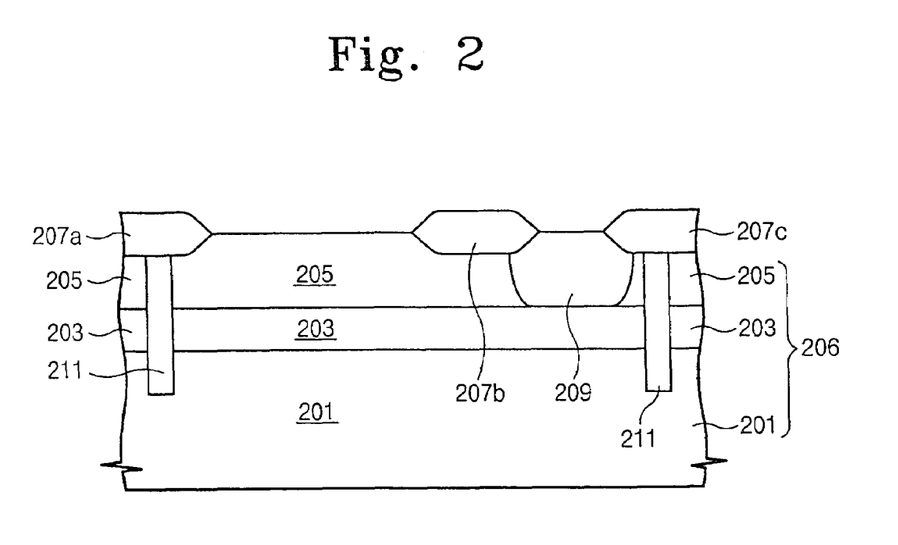
FIGS. 2 to 7 are cross-sectional views of an NPN bipolar transistor for describing a method of fabricating a bipolar transistor according to a first embodiment of the present disclosure.

Referring to FIG. 2, a substrate 206 having an emitter region is initially prepared, and can be formed as follows: At first, a high concentration N+ buried layer 203 (i.e., a sub-collector region) can be formed on a P-type semiconductor substrate 201 by heavily doping an N-type impurity, such as arsenic (As), through an ion implantation process or a solid-state diffusion process. Next, a lightly doped N-type epitaxial single crystal silicon layer 205 can be formed on the first high concentration N-type silicon region 203 through an epitaxial growth process. In order to form the epitaxial single crystal silicon layer 205, a phosphine $PH_3$ gas can be used as a dopant. Accordingly, the substrate 206 with emitter region is formed.

After forming the substrate 206 with emitter region, a field insulation layer 207a-207c can be formed through a typical device isolation process so as to define an active region. For example, the field insulation layer 207a-207c can be formed by selectively oxidizing the epitaxial silicon layer 205. The epitaxial silicon layer 205 can be selectively oxidized by forming an oxidization prevention mask, such as a siliconnitride layer, on the epitaxial silicon layer 205 and then performing the oxidization process.

A collector electrode 209 can then be formed by first performing ion-implantation process to inject an N-type impurity, such as phosphorous, into a portion of the lightly-doped silicon layer 205, then performing an annealing process. In order to reduce resistance of the collector electrode 209, a high concentration N-type impurity may be additionally implanted in the collector electrode 209.

A trench isolation layer 211 can also be formed to electrically isolate a given bipolar transistor from adjacent bipolar transistors. The trench isolation layer 211 can be formed as follows. First, a trench is formed by selectively etching a predetermined region of substrate 206. Then, the etched region is filled with an insulating material having superior gap filling characteristics. The trench isolation layer 211 may also be formed by filling the etched region with silicon after oxidizing the inner surface of the etched region.

In various embodiments, it should be appreciated that the sequence of forming the field insulating layer 207a-207c, the collector electrode 209 and the trench isolation layer 211 may be modified with little or no appreciable effect on the final product.

Figure 3:
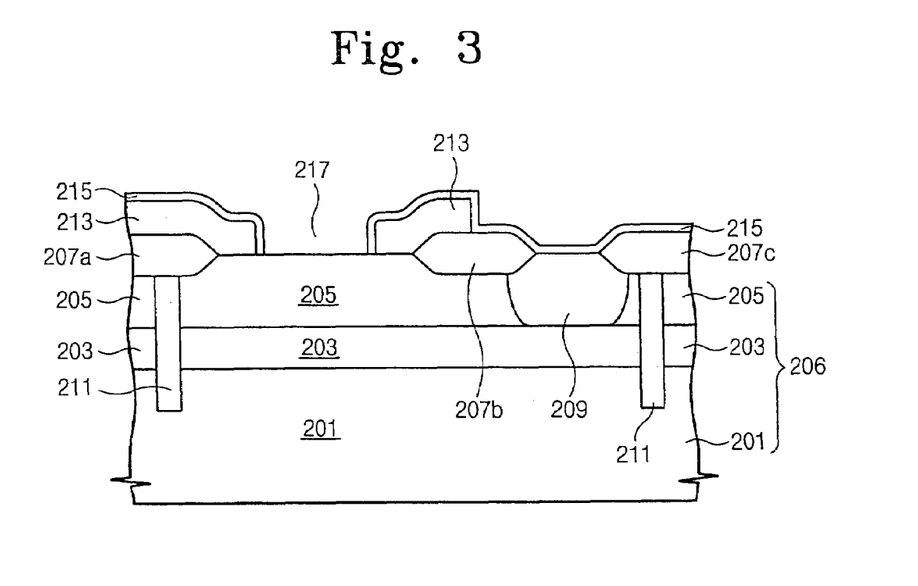

Referring to FIG. 3, a P-type impurity doped base electrode 213 can be formed by first forming an un-doped polysilicon layer, subsequently implanting a high concentration P-type impurity, such as boron, and then performing a patterning process. Then, an emitter window 217 can be formed to expose the N-type silicon layer 205 in a base-emitter region defined by the field oxidization layer 207a-207b by depositing and patterning an insulating layer 215.

Figure 4:
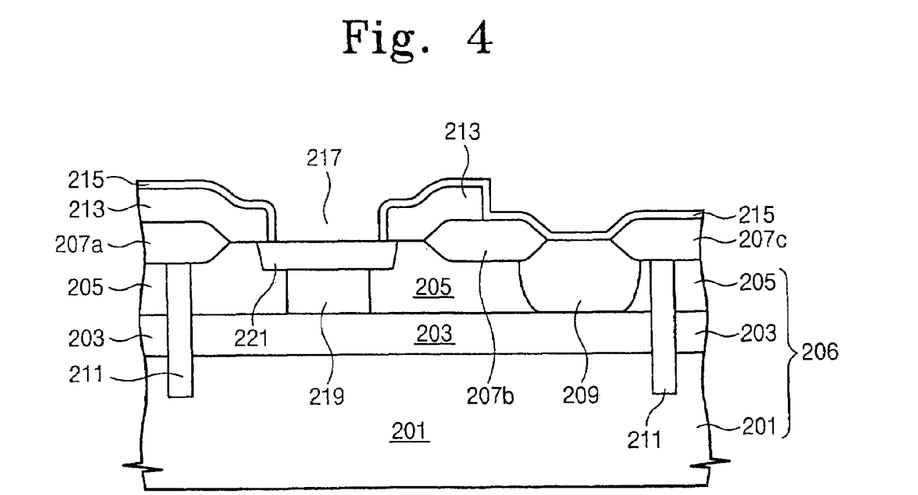

Referring to FIG. 4, an N-type collector region 219 and a P-type base region 221 can be formed by implanting impurity ions into the N-type epitaxial silicon layer 205 through the emitter window 217. An impurity, such as phosphorus (P), can be implanted to form the N-type collector region 219. Further, an impurity, such as boron (B), can be implanted to form the P-type base region 221. The concentration and the energy for the ion implantation may be controlled according to a target bipolar transistor characteristic. Impurities can be injected in order to link the base region 221 and the base electrode 213.

In various embodiments, the order of implanting the impurity ions for the base region-electrode link, the collector region 219 and the base region 221 may be modified with little or no appreciable effect on the final product.

After forming the N-type collector region 219 and the P-type base region 221, an emitter electrode and an emitter region can be formed. The method of forming the emitter electrode and the emitter region will be described with reference to FIGS. 5 and 6.

Figure 5:
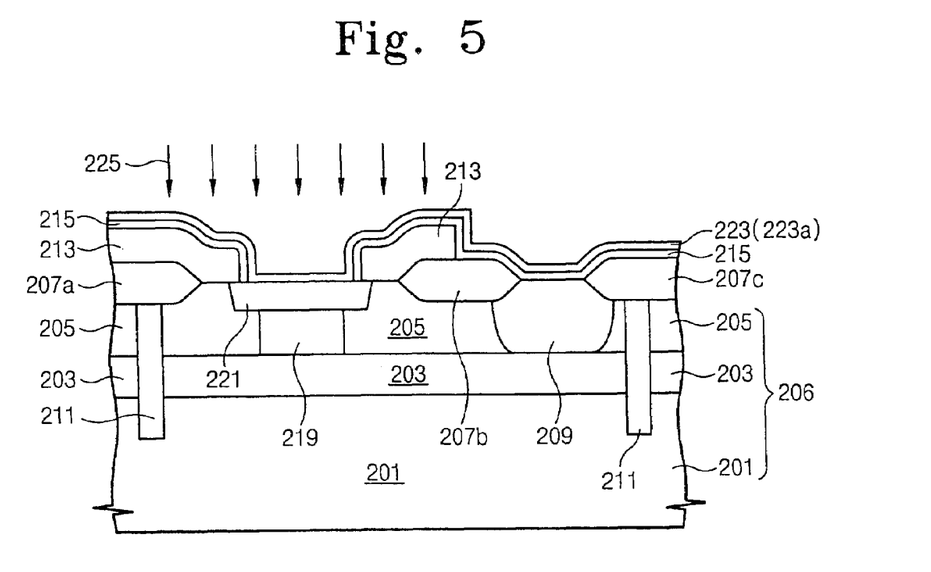

Referring to FIG. 5, an un-doped polysilicon layer 223 can be formed along the emitter window 223 to contact the base region 221. Then, an N-type impurity, such as an arsenic (As), can be implanted into the un-doped polysilicon layer 223 to form a first doped polysilicon layer 223a having an N-type impurity. In various embodiments, arsenic (As) can be implemented at the polysilicon layer 223 in a dose range of 1.0 to $2.0\times10^{16}/cm^2$ within an energy range of 50 to 70 keV.

Figure 6:
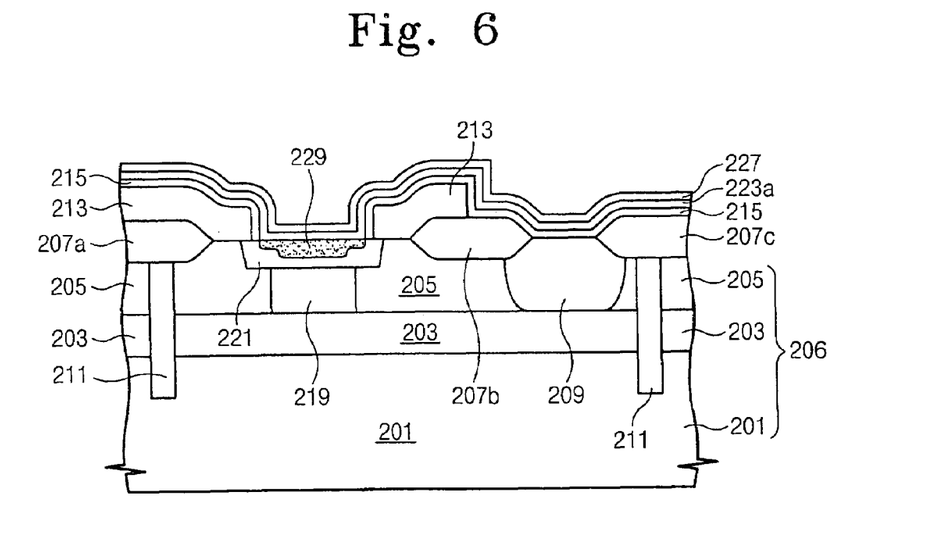

Referring to FIG. 6, an N-type impurity doped second polysilicon layer 227 can be then formed on the first polysilicon layer 223a. The N-type impurity doped second polysilicon layer 227 can be formed by an in-situ process that dopes N-type impurity while depositing polysilicon. In various embodiments, the N-type impurity doped second polysilicon layer 227 can be formed through a chemical vapor deposition CVD in a temperature about 580° C. using a $PH_3$ or $AsH_3$ gas as a doping gas, and using $Si_xH_y$ gas as a silicon source.

Next, a thermal drive-in process can be performed to diffuse the N-type impurities of the doped first polysilicon layer 223a into the base region 221 thus forming an emitter region 229. In a particular embodiment, the thermal process can be performed at a temperature about 900° C. for 20 to 30 minutes. During this emitter-forming thermal process, the N-type impurities of the second polysilicon layer 227 do not substantially diffuse into the base region 221 due to the intervention of the first polysilicon layer 223a. Therefore, the N-type impurity doped second polysilicon layer 227 barely influences the formation of the emitter region 229.

Together, the first and the second polysilicon layers 223a and 227 can function as an emitter electrode. The resistance of emitter electrode can be strongly related to the second polysilicon 227, which is the top layer of the emitter electrode. On the other hand, the first polysilicon 223a can have a primary influence on the emitter region 229. Thus, because the thickness and the impurity doping concentration of the second polysilicon layer 227 are not related (or barely related) to the concentration profile and the width of the emitter region 229, an emitter electrode having low resistance can be formed according to the present embodiment. At the same time, a superior 1/f noise characteristic and a gain deviation characteristic can be obtained through controlling the thickness of first polysilicon layer 223a.

Figure 7:
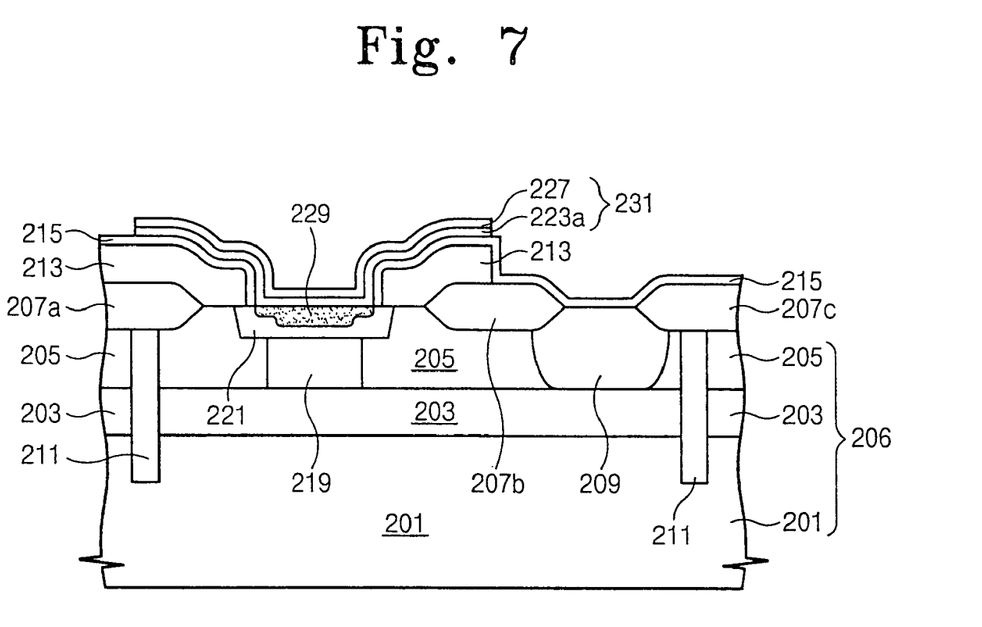

Referring to FIG. 7, an emitter electrode 231 can be formed by patterning the first polysilicon layer 223a and the second polysilicon layer 227 after the formation of the emitter region 229. Then, metal lines electrically connecting the base electrode 213, the emitter electrode 231 and the collector electrode 209 can be formed by depositing an inter-layer insulating layer, forming a contact hole, depositing a conductive layer and patterning the resulting thereof.

A thermal process may be performed in a hydrogen gas atmosphere at any process time after the formation of the emitter region 229. Such a thermal process in hydrogen gas has a benefit of curing the above-mentioned dangling bond issue. In various embodiments, it may useful to perform the thermal process more than two times.

In a particular embodiment, the thermal process may be performed while injecting 9000 sccm of hydrogen gas with a nitrogen gas. In another embodiment, it may be useful to perform the thermal process while injecting about 45000 sccm of hydride gas with a nitrogen gas. These thermal processes may be repeatedly performed, and in one embodiment the thermal process can be performed five times while injecting about 9000 sccm of hydrogen gas with the nitrogen gas.

The thermal process for forming the emitter region can be performed after forming the second polysilicon layer 227 in the above-mentioned embodiment. However, the thermal process for forming the emitter layer may be performed after forming the un-doped first silicon layer 223 and before forming the second polysilicon layer 227. In this case, it can inherently prevent the impurity of second polysilicon layer 227 from being diffused into the base region 221.

Also, the base region 221 can be formed through an ion implantation process in the above-mentioned embodiment. However, the base region 221 may be formed by forming a P-type epitaxial layer on the N-type epitaxial silicon layer 205 for the collector region. This P-type epitaxial layer for the base region may be formed of a silicon layer or a silicon-germanium layer.

Figure 8:
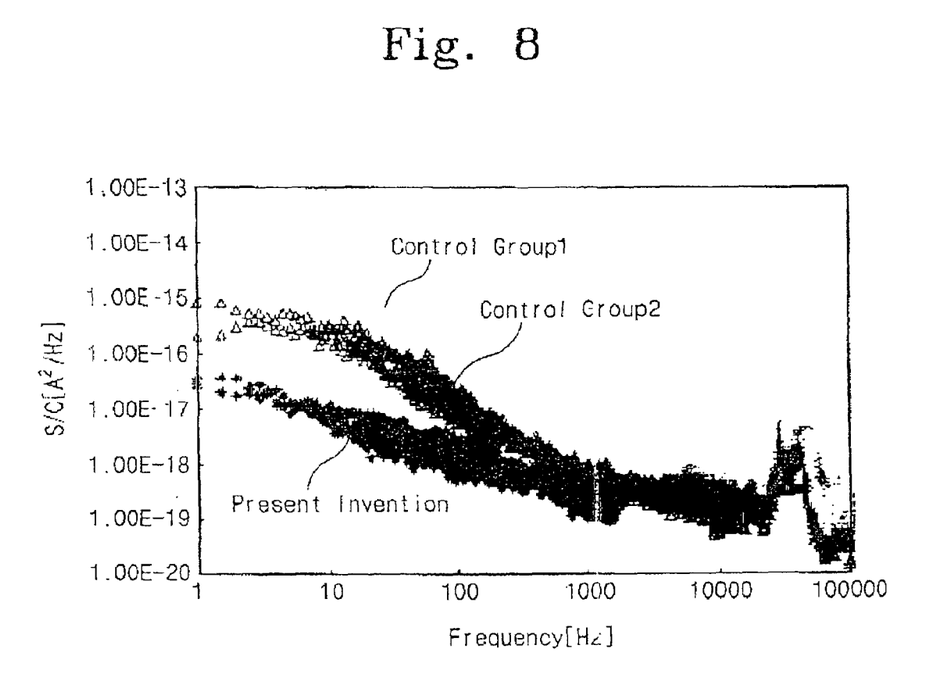
FIG. 8 is a graph showing 1/f noise characteristics of bipolar transistors of a first comparison group, a second comparison group and of the present disclosure.

As described above, the emitter electrode having low resistance can be formed by forming the emitter region and the emitter electrode using two polysilicon layers doped by different ways. Therefore, the bipolar transistor according to the present disclosure can simultaneously provide both superior 1/f noise characteristics and gain deviation characteristics. The advantages of the present disclosure can be recognized from Table 1 (shown below) and from FIG. 8. Table 1 shows gain and gain deviation characteristics of bipolar transistors made according to the present disclosure as compared to that of two comparison groups of conventional bipolar transistors. FIG. 8 shows comparative 1/f noise characteristics.

In Table 1 and FIG. 8, a first comparison group (Group 1) and a second comparison group (Group 2) are used to compare performance with transistors made according to the present disclosure.

The first comparison group shows characteristics of a bipolar transistor having an emitter electrode that is formed by depositing an un-doped polysilicon layer to have a thickness of about 2000 Å after performing the fabricating processes described with FIGS. 2 to 4, implanting arsenic (As) of $1 \times 10^{16}/cm^2$ with about 120 keV and performing the thermal process according to the related art.

The second comparison group shows characteristics of a bipolar transistor having an emitter electrode formed by depositing an un-doped polysilicon layer to have a thickness of about 2000 Å through an in-situ doping process after performing the fabricating processes described with FIGS. 2 to 4 and performing the thermal process according to the related art.

Meanwhile, the emitter electrode according to the present disclosure is formed by depositing a first un-doped polysilicon to have about 1000 Å, implanting arsenic (As) ions of $1 \times 10^{16}/cm^2$ with about 60 keV, depositing a phosphorus doped second polysilicon to have 1000 Å through the in-situ doping process and performing a thermal process.

In order to obtain highly reliable results, the thickness of the emitter electrode is set to 2000 Å for the first comparison group, the second comparison group and the present disclosure, identically.

Table 1 shows the gain deviation characteristics obtained from five bipolar transistors after forming a plurality of bipolar transistors on a substrate according to the above described fabricating methods.

TABLE 1

| Emitter electrode structure | Gain deviation (gain average) |
| --- | --- |
| First comparison group 1 | 18.14 (192.29) |
| Second comparison group 2 | 71.57 (265.92) |
| Present disclosure methods | 11.09 (191.01) |

As shown in Table 1, the gain average of transistors of the present disclosure is 191.01, which is a level of gain required of a high-performance bipolar transistor. Also, Table 1 shows that transistors of the present disclosure has superior gain deviation characteristics compared to both the first and the second comparison groups. As shown, the second comparison group has bad gain deviation characteristics although the second comparison group has a greater gain average compared to the present disclosure.

FIG. 8 is a graph showing 1/f noise characteristics of bipolar transistors of the first comparison group, the second comparison group and the present disclosure. A vertical axis denotes a power/frequency, and a horizontal axis denotes operating frequency of bipolar transistor. The power/frequency is obtained by measuring a current at an output terminal of bipolar transistor and squaring the measuring result. FIG. 8 shows that the present disclosure has superior 1/f noise characteristics compared to the first and the second comparison groups. In particular, FIG. 8 shows that transistors manufactured according to the disclosed methods generate 10 times less noise than the first comparison group (Group 1) and 100 times less noise than the second comparison group (Group 2) for frequencies under 100 MHz.

It will be apparent to those skilled in the art that various modifications and variations can be made in the present disclosure. Thus, it is intended that the present disclosure covers the modifications and variations of this present disclosure provided they come within the scope of the appended claims and their equivalents.

What is claimed is:

1. A method of forming a bipolar transistor, said method comprising:
   forming a base region of a first conductivity type in a collector region of a second conductivity type, wherein the collector region is formed on a substrate of the first conductivity type;
   forming a first silicon layer of the second conductivity type on the base region using a first formation process;
   forming a second silicon layer of the second conductivity type on the first silicon layer using a second formation process which is different than the first formation process;
   wherein the secon silicon layer of the second conductivity type barely influences the formation of the emitter region
   outdiffusing impurities from the first silicon layer into the base region to form an emitter region, wherein outdiffusion of impurities of the second silicon layer into the base region is inhibited by the first silicon layer interposed between the second silicon layer and the base region.

2. The method of claim 1, wherein the first formation process includes depositing an un-doped silicon layer on the base region, and implanting impurity ions of the second conductivity type in the deposited un-doped silicon layer, and
   wherein the second formation process includes depositing a doped silicon layer which is implanted with impurity ions of the second conductivity type during deposition of the doped silicon layer.

3. The method of claim 2, wherein the impurity ions of the second conductivity type are implanted in the deposited un-doped silicon layer at a dosage of 1.0 to $2.0 \times 10^{16}/cm^2$ and with an energy of 50 to 70 keV.

4. The method of claim 2, wherein the outdiffusing of impurities includes performing a thermal process on the second silicon layer at about 900° C. for about 20 to 30 minutes.

5. The method of claim 2, wherein the second formation process includes vapor deposition at about 580° C. with $Si_xH_y$ and at least one of a $PH_3$ and $AsH_3$ source gases.

6. The method of claim 1, further comprising performing a thermal treatment in a hydrogen atmosphere after forming the emitter region.

7. The method of claim 6, wherein the thermal process is performed at least is performed at least twice and include injection into a chamber of about 9000 sccm hydrogen gas with a nitrogen gas.

8. A method of forming a bipolar transistor comprising:
   forming a buried layer and an epitaxial layer for a collector region on a substrate, wherein the buried layer and the epitaxial layer are both of a second conductivity type and wherein the substrate is of a first conductivity type;
   forming an impurity region of a second conductivity type in the epitaxial layer, the impurity region being electrically connected to the buried layer to form at least a portion of a collector electrode;

forming a doped polysilicon base electrode of a first conductivity type impurity to expose the epitaxial layer;

forming a base region on the exposed epitaxial layer;

forming an insulation layer having an emitter window that exposes a portion of the base region on the base region and the polysilicon base electrode;

forming a first un-doped silicon layer on a bottom and side walls of the emitter windows to form at least a portion of an emitter electrode;

implanting a second conductivity type of impurity ion in the first un-doped silicon layer;

forming a second silicon layer on the first silicon layer while doping the second silicon layer with a second conductivity type impurity; wherein the doped second silicon layer barely influences the formation of the emitter region forming an emitter region by diffusing the second conductivity type impurity of the first silicon layer into the base region, wherein outdiffusion of impurities of the second silicon layer into the base region is inhibited by the first silicon layer interposed between the second silicon layer and the base region.

9. The method of claim 8, wherein the step of implanting the second conductivity type impurity into the first un-doped silicon layer includes implanting a second conductivity type impurity ion at a dose range of 1.0 to $2.0 \times 10^{16}/cm^2$ with an energy range of 50 to 70 keV.

10. The method of claim 8, wherein the diffusing of the second conductivity type impurity includes performing a thermal process on the second silicon layer at about 900° C. for about 20 to 30 minutes.

11. The method of claim 8, wherein the forming of the second silicon layer on the fist silicon layer includes performing a vapor depositing at about 580° C. using one of a $PH_3$ gas and an $AsH_3$ gas as the second conductivity type impurity, and using $Si_xH_y$ gas as silicon source.

12. A bipolar transistor, comprising:
an epitaxial layer of a second conductivity type formed on a buried layer of a second conductivity type, wherein the buried layer is formed on a substrate of a first conductivity type;
a collector region formed within the epitaxial layer and electrically connected to the buried layer;
a collector electrode formed as an impurity region of a second conductivity type, the collector electrode being formed in the epitaxial layer and electrically connected to the buried layer;
a base electrode formed on a portion of the epitaxial layer, the base electrode being a silicon layer doped with a first conductivity type impurity;
a base region formed in the epitaxial layer at a location exposed by the base electrode silicon layer;
an emitter electrode that includes a first silicon layer formed on the base region, insulated from the base electrode silicon layer and implanted with impurities of a second conductivity type, wherein the emitter electrode further includes a second silicon layer formed on the first silicon layer and doped with impurities of a second conductivity type; wherein the doped second silicon layer barely influences the formation of the emitter region
an emitter region of a second conductivity type, the emitter region being formed in the base region by diffusing the impurities of the first silicon layer into the base region, wherein outdiffusion of impurities of the second silicon layer into the base region is inhibited by the first silicon layer interposed between the second silicon layer and the base region.

13. The method of claim 12, wherein the first silicon layer is formed by performing an ion implantation in a dose range of 1.0 to $2.0 \times 10^{16}/cm^2$ within an energy range of 50 to 70 keV after forming un-doped silicon layer.

14. The bipolar transistor of claim 12, wherein the second silicon layer is formed by performing a vapor depositing at about 580° C. using a $Si_xH_y$ gas as a silicon source, and using one of a $PH_3$ gas and a $AsH_3$ gas as the second conductivity type impurity.

15. A bipolar transistor comprising:
a collector region of a second conductivity type formed on a substrate of a first conductivity type;
a base region of a first conductivity type formed on the collector region;
a first silicon layer implanted with a second conductivity type of impurities;
a second silicon layer formed on the first silicon layer and in-situ doped with a second conductivity type of impurities; wherein the doped second silicon layer barely influences the formation of the emitter region
an emitter region formed in the base region, the emitter region formed by diffusing the impurities of the first silicon layer into the base region, wherein outdiffusion of the impurities of the second silicon layer into the base region is inhibited by the first silicon layer interposed between the second silicon layer and the base region.

16. The bipolar transistor of claim 15, wherein the first silicon layer is formed by first forming an un-doped silicon layer, then implanting impurities in a dose range of 1.0 to 2.0×1016/cm2 within an energy range of 50 to 70 keV onto the un-doped silicon layer.

17. The bipolar transistor of claim 15, wherein the second silicon layer is formed by performing a vapor depositing at about 580° C. using a $Si_xH_y$ gas as a silicon source, and using at least one of a $PH_3$ gas and a $AsH_3$ gas as a dopant.

* * * * *